United States Patent [19]
Fritz et al.

[11] Patent Number: 5,895,960
[45] Date of Patent: Apr. 20, 1999

[54] THIN OXIDE MASK LEVEL DEFINED RESISTOR

[75] Inventors: David Marlin Fritz, Lehighton, Pa.; Yue-Kai Lo, Hsinchu, Taiwan; Zhigang Ma, Bethlehem; Yehuda Smooha, South Whitehall Township, both of Pa.

[73] Assignee: Lucent Technologies Inc., Murray Hill, N.J.

[21] Appl. No.: 08/935,521

[22] Filed: Sep. 23, 1997

Related U.S. Application Data

[63] Continuation of application No. 08/706,859, Sep. 3, 1996, abandoned.

[51] Int. Cl.$^6$ .................................... H01L 23/62
[52] U.S. Cl. ................... 257/359; 257/528; 257/536
[58] Field of Search ........................... 257/528, 536, 257/359

[56] References Cited

U.S. PATENT DOCUMENTS

| | | | |
|---|---|---|---|
| 4,128,845 | 12/1978 | Sakai | 257/588 |
| 4,167,804 | 9/1979 | Greenstein | 438/330 |
| 4,876,584 | 10/1989 | Taylor | 257/358 |
| 4,990,802 | 2/1991 | Smooha | 257/360 |
| 5,300,805 | 4/1994 | Demicheli et al. | 257/503 |
| 5,502,328 | 3/1996 | Chen et al. | 257/546 |

*Primary Examiner*—Valencia Martin-Wallace

[57] ABSTRACT

An integrated circuit includes a resistor formed in a doped tub located in a semiconductor substrate. A first highly doped resistor contact region extends outward from the associated contact windows towards a second highly doped resistor contact region. The extent of the underlying tub region that lies between the highly doped tub contact regions largely determines the resistance value. The size and geometry of the highly doped resistor contact regions, and hence the resistance of the resistor, is typically determined by the same mask that defines the thin oxide regions of field effect transistors formed on the IC. In a typical application, the resistor is connected between an output buffer and a bondpad. A multiplicity of output buffers on an IC chip may each connect to corresponding bondpads using a multiplicity of the inventive resistors, which may have the same, or alternatively differing, resistance values. The resistors typically are designed to have identical external dimensions, and so layout of the resistors is facilitated for various types of IC types, including for example application specific integrated circuits (ASICs).

7 Claims, 3 Drawing Sheets

THIN OXIDE MASK LEVEL DEFINED RESISTOR

This is a continuation of application Ser. No. 08/706,859 filed on Sep. 3, 1996 now abandoned.

BACKGROUND OF THE INVENTION

1. Field of the Invention

The present invention relates to an integrated circuit having a resistor.

2. Description of the Prior Art

Integrated circuits (ICs) often include resistors formed in doped substrate regions, which may be doped tubs, alternatively referred to as "wells" in the art. For example, a p-tub resistor or n-tub resistor may be used, which are generically referred to herein as "tub resistors". In particular, Application Specific Integrated Circuits (ASICs) typically include resistors that are located in the vicinity of the output buffers. As shown in FIG. 1, a typical output buffer comprises complementary inverter transistors 100 and 101 coupled to bondpad 103 through output resistor 102. It is usually desirable to be able to choose the resistance value (e.g., $R_1$) of a given output resistor (e.g., 102) during the design of the IC. This allows for optimizing the output buffer drive level with respect to the anticipated load that is to be connected to the IC output terminals. For example, a relatively high impedance load is usually driven through a relatively high resistance value output resistor, in order to minimize noise due to excessive output current flow. On the other hand, a relatively low impedance load is usually driven through a relatively low value output resistor, to provide sufficient output current to drive the load at sufficiently high speed. In practice, the doping level of the substrate resistor is usually fixed by the IC process used to form the integrated circuit. Therefore, the choice of doping level is not usually available to the designer of the IC chip for determining the value of the output resistor. Rather, the size and geometry of the output resistor is usually chosen to obtain the desired resistance value.

For example, referring to FIG. 2, a prior-art output resistor is formed in a n-doped doped tub 201 located in a p-type substrate 200. A field oxide layer overlies the tub in regions 202, 203 and 204, and prevents dopants from being implanted into the tub region, except in the heavily doped (n+) contact regions 205 and 206. These contact regions are typically formed with the same dopant implant step used to form the source and drain regions of the field effect transistors (not shown). These dopants are implanted through the "thin oxide" layer that is used as the gate oxide of the transistors (not shown), and which is subsequently removed from the contact regions by etching. The substrate contact regions thereby define a substrate resistor having a length L as shown, and a width W, being the dimension perpendicular to the view shown in FIG. 2. Both the thin oxide regions and the field oxide regions are typically then overlaid by a dielectric layer, which is patterned to form regions 207, 208 and 209. The dielectric layer is typically phosphosilicate glass (PSG) or boro-phosphosilicate glass (BPSG) that is re-flowed by heating after deposition for planarization purposes, but other materials (e.g. undoped silicon dioxide) are possible, with various planarization techniques known in the art. The resistor contact regions 205 and 206 are themselves contacted by conductors that extend from an overlying conductor layer through the dielectric layer via windows 210 and 211, respectively. In this manner, connection of the resistor to other components (e.g., output buffer and bondpad) may be accomplished.

Examples of prior-art resistors are illustrated in top view in FIGS. 3 and 4. In a first example shown in FIG. 3, a relatively high resistance resistor is formed in a tub region 300 having highly doped resistor contact regions 301 and 302. The contact windows 303 and 304 extend down through the overlying dielectric (not shown for clarity) to allow the metal contact layer (not shown) to contact the respective contact regions. The resistance of this resistor is determined by the sheet resistivity of the tub region between the heavily doped contact regions, as well as the size of the tub region. Therefore, the resistance may be selected by the chip designer by the choice of the resistor length $L_1$, which is the spacing between the contact regions, as well as the width $W_1$ of the contact regions. In effect, the resistor width is also influence by the tub width $W_{tub\ 1}$, so that the effective width lies between $W_1$ and $W_{tub\ 1}$. In a second example shown in FIG. 4, a relatively low resistance resistor is formed in a doped tub 400, with highly doped contact regions 401 and 402 being contacted through contact windows 402 and 404, respectively. The resistor in FIG. 4 is hence similar to the resistor in FIG. 3, except that the length $L_2$ is less than $L_1$ and the width $W_2$ is greater than $W_1$. Therefore, the resistor in FIG. 4 has a lower resistance value than that of FIG. 3, assuming that they are formed in otherwise identically doped tub regions.

However, it can be seen that when laying out the resistor of FIG. 4, the designer is faced with a different geometry than that of FIG. 3. Accommodating both large and small resistance values for an output buffer typically involves problems in fitting the resistors to the available free space. This is especially of concern in ASICs, where defined software library elements, the so-called "standard cells", are required. It is hence desirable to have improved techniques for forming resistors that may implement a range of resistance values in a given defined space.

SUMMARY OF THE INVENTION

We have invented an integrated circuit having a diffused resistor formed in a doped tub region and comprising a first highly doped resistor contact region that extends toward a second highly doped resistor contact region. The extent of the underlying tub region that lies between the highly doped contact regions largely determines the resistance value. The resistor is typically defined by a masking operation that also defines the gate dielectric areas on the IC. In a typical application, the resistor is connected between an output buffer and a bondpad. A multiplicity of output buffers on an IC chip may each connect to corresponding bondpads using a multiplicity of the inventive resistors, which may have the same, or alternatively differing, resistance values.

DETAILED DESCRIPTION

The following detailed description relates to an integrated circuit having a substrate resistor, and a method of making it. In the inventive technique, a first highly doped tub contact region extends toward a second highly doped tub contact region. The resistance of the resistor is largely the gap between the first and second highly doped tub contact regions. The highly doped tub contact regions may be formed under a thin dielectric region by IC fabrication techniques otherwise known in the art. The thin dielectric, typically silicon dioxide, defines the gate, source and drain regions of field effect transistors formed one thin dielectric is conventionally referred to as the "gate oxide", or "thin oxide", to distinguish the surrounding "field oxide" regions. In a typical application, the resistors are used to connect output buffers to their respective bondpads, but with numerous other applications being possible.

Figure 3:
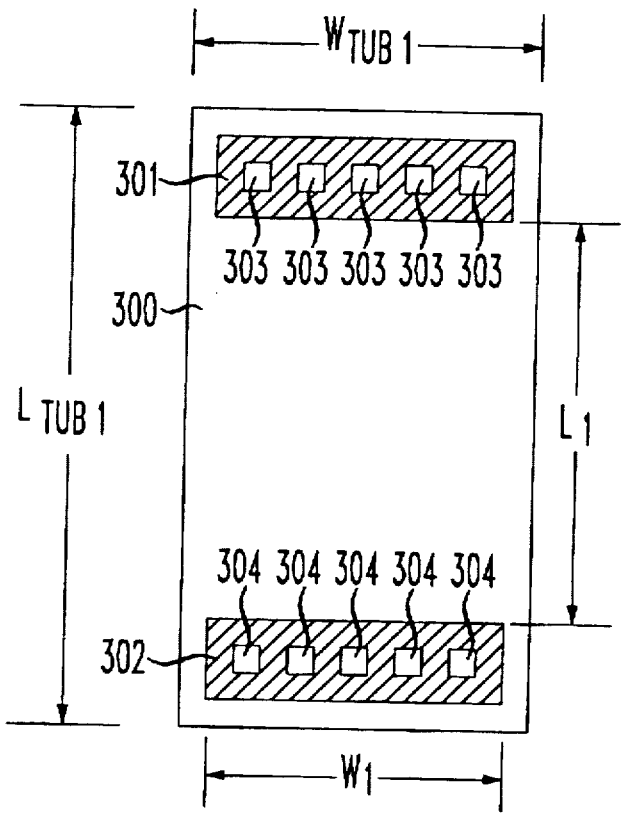
FIG. 3 illustrates a top view of a first prior art resistor.
Figure 4:
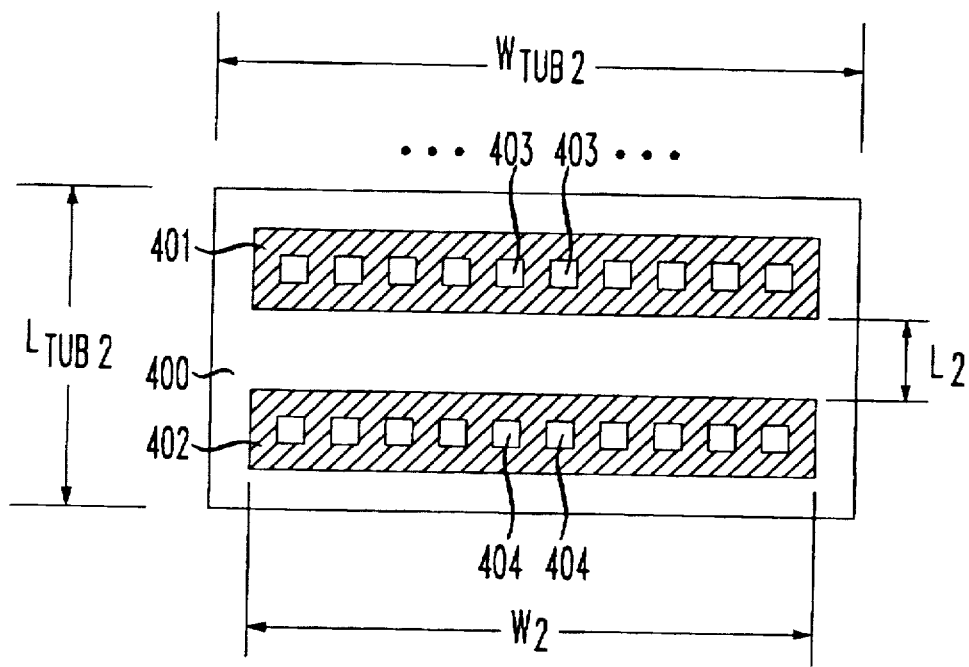
FIG. 4 illustrates a top view of a second prior art resistor.
Figure 5:
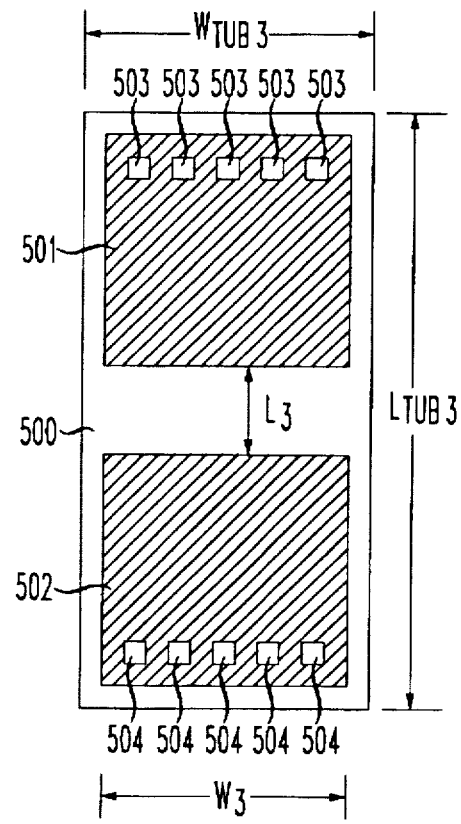
FIG. 5 illustrates a top view of a first embodiment of the invention.
Figure 6:
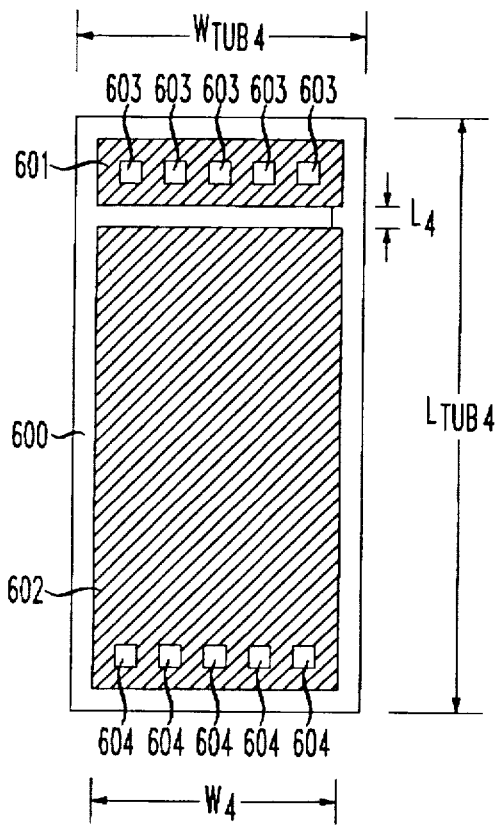
FIG. 6 illustrates a top view of a second embodiment of the invention.

Referring to FIG. 5, a first embodiment of the application is illustrated. The so-called "thin oxide" regions 501 and 502 define the regions of relatively high tub conductivity, due to relatively high n or p doping levels, that lie beneath the thin oxide in a p-tub or n-tub. The "field oxide" 500 is all of the o thin IC area shown, and overlies the substrate regions (e.g. tubs) that are less conductive, since they do not receive the high dose source/drain implants. The window openings 503 through the above-noted dielectric layer provide electrical contact to the first highly doped region 501, whereas the window openings 504 provide contact to the second highly doped region 502. It can be seen that the highly doped contact regions 501 and 502 extend outward from the vicinity of the contact windows 503 and 504, respectively. The resistance of the resistor of FIG. 5 is determined primarily by the values of $L_3$ and $W_3$ as indicated. Therefore, the resistance of the resistor of FIG. 5 may be chosen to be considerably less than that of a prior-art resistor (e.g., FIG. 3) for comparable tub dimensions ($L_{tub3}$, $W_{tub3}$) as viewed from the top. Another embodiment of the invention is shown in FIG. 6, wherein a highly doped resistor contact region 602 formed in doped tub region 600 extends outward from contact windows 604 toward contact windows 603 in highly doped region 601. The resistance is determined by $L_4$ and toward contact windows 603 in highly doped region 601 $W_4$, which again is less than that of a prior-art resistor for comparable resistor tub dimensions ($L_{tub4}$, $W_{tub4}$). use of the inventive resistor provides the designer with considerable The use of the inventive resistor provides the designer with considerable design flexibility, since the exterior size of the resistor region, indicated by length $L_{tub3}$, $L_{tub4}$ and with $W_{tub3}$, $W_{tub4}$ in FIGS. 5 and 6, may remain constant while still obtaining a desired value of resistance. That is, the choice of the size and shape of the resistor heavily doped (e.g. thin oxide) region will determine the effective value of the length of the resistor, as well as its width. The shape of the heavily doped extended region(s) has been indicated as rectangular in the case of FIGS. 5 and 6. However, other shapes are possible. For example, heavily doped interdigitated "finger" regions may extend from the two resistor contact regions. That configuration can provide a relatively high ratio of effective resistor width for a given effective length, so that the resistance may be made relatively low. Again, the exterior dimensions of the resistor region may remain constant. Therefore, the present technique allows for easier layout of resistors in standard cell output buffers, among various other applications that will be apparent to persons of skill in the integrated circuit art.

Note that the total resistance of a tub resistor is determined by the dimensions and doping of the highly doped contact regions, in addition to the resistance of the tub region between the contact regions. However, the resistance of the highly doped contact regions may be negligible in the case of relatively high resistance resistors, especially in the case wherein a metal silicide layer is formed on top of the heavily doped tub contact regions.

Figure 1:
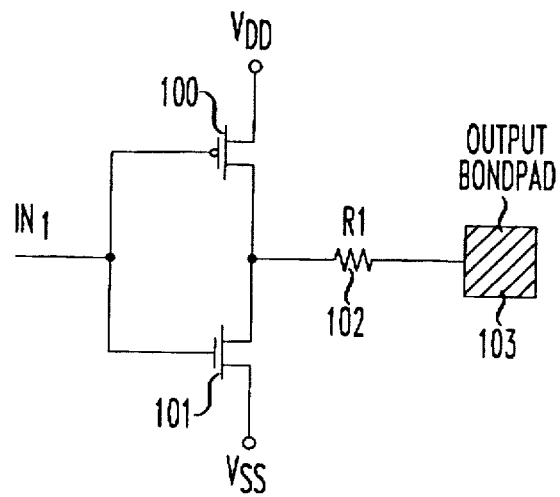
FIG. 1 illustrates a prior art output buffer configuration.
Figure 1:
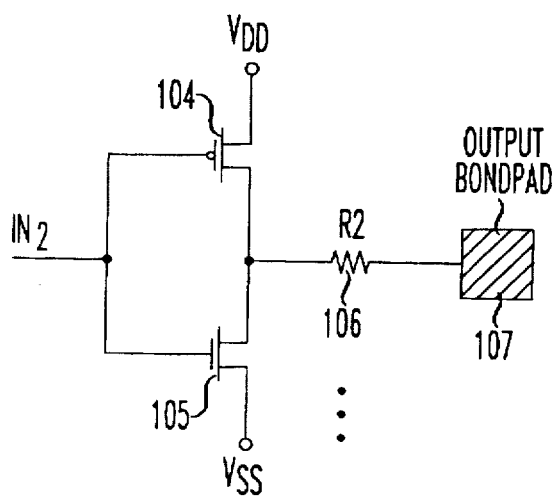
Figure 2:
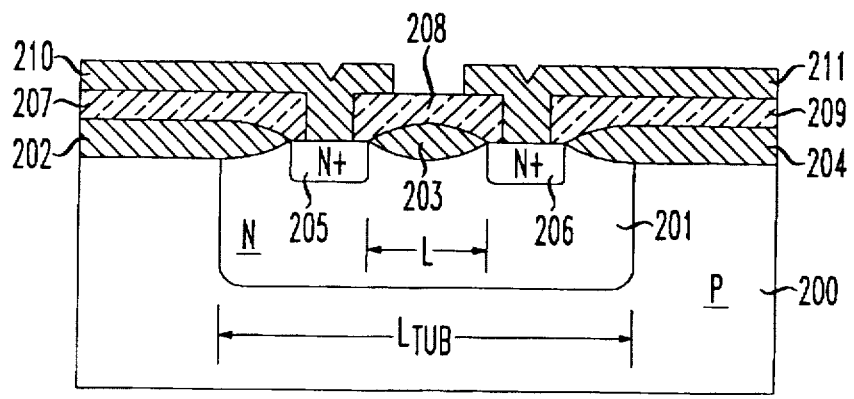
FIG. 2 illustrates a cross section view of a prior art diffused tub resistor.

In a typical IC fabrication sequence, the tub regions are formed by techniques known in the art in the semiconductor substrate. Thereafter, the thin oxide regions are defined, typically by patterning a silicon nitride layer and growing the field oxide in regions where the silicon nitride is absent. Thereafter, a high implant dose mask, typically a patterned photoresist, is formed over the p+ source/drain regions to shield them from the subsequent n+ implant, which forms the highly doped contact regions. In the prior art, the high dose implant mask for the resistor regions has extended over only the thin oxide regions, which were confined to the vicinity of the contact windows. However, in the inventive technique, the high dose implant mask for the resistor regions typically covers the entire tub region, in order to accommodate any desired geometry previously defined by the thin oxide mask. Thereafter, a dielectric layer, typically a doped glass, is deposited and patterned to form contact windows. A metal layer is then deposited to extend into the contact windows and electrically connect the heavily doped contact regions to other circuitry on the integrated circuit, as shown for example in FIG. 1. (Other steps, for example depositing and patterning polysilicon, are typically included in this sequence).

To customize the resistance value with only one masking level (the thin oxide mask), it is desirable to maintain the tub, high implant dose and the contact window masks a pre-set geometry. Therefore, the thin oxide mask will then determine what tub regions will actually receive the high dose implant, since the high dose implant cannot penetrate the field oxide regions.

The invention claimed is:

1. An integrated circuit comprising a diffused resistor having a first set of contact windows for contacting a first highly doped region and a second set of contact windows for contacting a second highly doped region, wherein the first and second highly doped regions are separated by a less heavily doped region, characterized in that at least one of said highly doped regions extends outward from the associated contact windows towards the other of said highly doped regions for a distance which defines a desired length of less heavily doped material between said highly doped regions, thereby establishing a desired width to length ratio of said less heavily doped material and, consequently, determining a desired resistance value for said diffused resistor.

2. The invention of claim 1 wherein both said first and second highly doped regions extend outward a comparable distance from their associated contact windows.

3. The invention of claim 1 wherein said first highly doped region extends outward a greater distance from its associated contact windows than said second highly doped region extends from its associated contact windows.

4. The invention of claim 1 wherein said highly doped regions are n+ regions formed in a p-tub located in an n-type semiconductor substrate.

5. An integrated circuit having a plurality of output buffers connected to bondpads through output resistors, characterized in that said output resistors are diffused output resistors each formed in a doped tub region of a given conductivity type formed in a substrate of the opposite conductivity type, and each tub having identical external sizes, wherein the value of resistance of each resistor is determined by the width to length ratio of a less heavily doped region lying between spaced-apart first and second heavily doped contact regions of said opposite conductivity type formed in said tub region, and wherein overlying conductors contact said first and second heavily doped contact regions through first and second sets of contact windows, respectively.

6. The invention of claim 5 wherein a first of said output buffers is connected to its bondpad through a first output resistor, a second of said output buffers is connected to its bondpad through a second output resistor, and further characterized in that the spacing between said first and second heavily doped contact regions of said first output resistor is different than the spacing between said first and second heavily doped contact regions of said second output resistor, whereby the resistance of said first output resistor is different than the resistance of said second output resistor.

7. The invention of claim 5 wherein said given conductivity type is p-type, and said opposite conductivity type is n-type.

* * * * *